(12) United States Patent
Bliss et al.

(10) Patent No.: US 7,053,801 B2
(45) Date of Patent: May 30, 2006

(54) HIGH RATE CODING FOR MEDIA NOISE

(75) Inventors: William G. Bliss, Thornton, CO (US); Andrei Vityaev, Soquel, CA (US); Razmik Karabed, San Jose, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/869,843

(22) Filed: Jun. 18, 2004

(65) Prior Publication Data

US 2004/0222905 A1 Nov. 11, 2004

Related U.S. Application Data

(63) Continuation of application No. 10/253,911, filed on Sep. 25, 2002, now Pat. No. 6,788,223.

(51) Int. Cl.
 *H03M 7/00* (2006.01)
(52) U.S. Cl. .............................. 341/50; 341/51; 341/58
(58) Field of Classification Search ................. 341/50, 341/51, 58, 59, 68; 714/782, 786; 369/59.21
 See application file for complete search history.

(56) References Cited

U.S. PATENT DOCUMENTS

| 5,142,421 A | 8/1992 | Kahlman et al. |
| 5,220,568 A | 6/1993 | Howe et al. ................. 714/782 |
| 5,544,178 A | 8/1996 | Zook ........................... 714/786 |
| 5,635,933 A | 6/1997 | Fitzpatrick et al. ........... 341/58 |
| 5,757,294 A | 5/1998 | Fisher et al. .................. 341/59 |
| 5,949,357 A | 9/1999 | Fitzpatrick et al. ........... 341/68 |
| 6,052,072 A | 4/2000 | Tsang et al. .................. 341/59 |
| 6,154,870 A * | 11/2000 | Fredrickson et al. ........ 714/786 |
| 6,185,173 B1 | 2/2001 | Livingston et al. ...... 369/59.21 |
| 6,229,458 B1 | 5/2001 | Altekar et al. |
| 6,388,587 B1 | 5/2002 | Brickner et al. |
| 6,411,224 B1 | 6/2002 | Wilson et al. |
| 6,492,918 B1 | 12/2002 | Rezzi et al. ................... 341/68 |

FOREIGN PATENT DOCUMENTS

EP 0 633 571 A2 1/1995

OTHER PUBLICATIONS

B.E. Moision, P.H. Siegel, and E. Soljanin, "Distance-enhancing codes for digital recording," IEEE Trans. Magn., vol. 34, No. 1, pp. 69-74, Jan. 1998.

(Continued)

Primary Examiner—Jean Bruner Jeanglaude
(74) Attorney, Agent, or Firm—Staas & Halsey LLP

(57) ABSTRACT

An apparatus has a conversion circuit, a precoder circuit, and a selection circuit. The conversion circuit converts user data $b_1, b_2, b_3 \ldots b_k$ to a coded sequence $c_0, c_1, c_2 \ldots c_q$. The selection circuit selects $c_0$ in the coded sequence $c_0, c_1, c_2 \ldots c_q$ such that the output of the precoder circuit has less than a maximum number q of transitions. The conversion circuit may include an encoder circuit to convert user data $b_1, b_2, b_3 \ldots b_k$ to a sequence $c_1, c_2 \ldots c_q$, and a transition minimization circuit to add $c_0$ to the sequence $c_1, c_2 \ldots c_q$. The apparatus may have a circuit to add at least one additional bit, which may be a parity bit, to the coded sequence $c_0, c_1, c_2 \ldots c_q$.

10 Claims, 2 Drawing Sheets

OTHER PUBLICATIONS

Umemoto, "On Coding and Decoding for High-order Partial Response Systems", IEEE Transactions on Magnetics, vol. 34, No. 1, Jan. 1998, pp. 80-84.

Lee et al., "Modulation Codes for Precoded Partial Response Channels", IEEE Transactions on Magnetics, vol. 32, No. 5, Sep. 1996, pp. 3986-3988.

* cited by examiner

HIGH RATE CODING FOR MEDIA NOISE

This application is a continuation of Ser. No. 10/253,911 filed Sep. 25, 2002 now U.S. Pat. No. 6,788,223.

BACKGROUND OF THE INVENTION

1. Field of the Invention

The present invention relates to apparatus and methods to encode information to reduce a probability of errors in a transmission and/or a recording (storage) of the information.

2. Description of the Related Art

In magnetic recording, various sources of noise can corrupt accurate information (for example, thermal noise, interference, and media noise arising from sources such as jitter, DC erase noise, and pulse width/height modulation). Media noise is a dominant source of noise in many current recording systems. The media noise is usually treated as highly correlated non-stationary noise added to a read-back signal. "Transition jitter" is the dominant component of media noise and affects the position of transitions.

RLL Coding schemes use (d, k) constraints, which limit a minimum and a maximum run lengths of zeros, respectively, or alternatively, the schemes control high and low frequency contents of user data. Conventional high-rate RLL (0, k) codes are highly complex for circuit implementation and relatively "blind" in terms of error detection during a demodulation process. The d, k constraints include properties of the conventional codes exploitable for error control purposes. However, this specialized type of error is only a small subset of the total number of possible errors.

A construction of an encoder, which encodes arbitrary binary sequences into sequences, is needed that obeys a specific run-length-limited (RLL) constraint. It is important that the encoder encodes data at a high rate, that the decoder does not propagate channel errors, and that a complexity of encoding and decoding be low.

White noise is added to every symbol entering a channel in a magnetic recording medium. Media Noise, like white noise, is random. Unlike the white noise, the media noise is not added to every symbol. The media noise happens only when there is a transition on the input to the channel. For example, if we input 00010110, then we have media noise when the input changes from a "0" to a "1" and from a "1" to a "0". The denser a signal is written onto the magnetic recording medium, the more severe media noise becomes. Thus, a recording density controls a ratio of media noise to white noise. For instance, a ratio of 50:50 may be one example.

Let n_j, n_w, and n_e to denote components of media noise, n, due to jitter, j, pulse width noise, w, and electronic noise, e, respectively.

n=n_j+n_w+n_e+n', where, n', represents all other noises.

Components n_j and n_w are proportional to a number of pairs, $(x(i), x(i+1))$, that are (0, 1) or (1, 0). In other words, n_j and n_w, are proportional to a number of times there is a transition in the x sequence either from 0 to 1, or from 1 to 0. Because, n_j and n_w depend on input data, the error performance of the system can vary significantly with the data. Sequences, x, having few transitions will suffer less from, n_j and n_w, than those having many transitions. Accordingly, an encoder is needed to reduce media noise from being added to an input of the channel $x(i)$.

SUMMARY OF THE INVENTION

Various objects and advantages of the invention will be set forth in part in the description that follows and, in part, will be obvious from the description, or may be learned by practice of the invention.

According to one aspect, an apparatus has a conversion circuit, a precoder circuit and a selection circuit. The conversion circuit converts user data $b_1, b_2, b_3 \ldots b_k$ to a coded sequence $c_0, c_1, c_2 \ldots c_q$. The precoder circuit having an initial state $(s_2(0), s_1(0))$ produces an output $x_0, x_1, x_2 \ldots x_q$ from the coded sequence $c_0, c_1, c_2 \ldots c_q$ as follows: $x(i)=c(i) \oplus s_2(i-2)$, where $(x(-2), x(-1))=(s_2(0), s_1(0))$.

The selection circuit selects $c_0$ in the coded sequence $c_0, c_1, c_2 \ldots c_q$ such that the output $x_0, x_1, x_2 \ldots x_q$ of the precoder circuit has less than a maximum number q of transitions.

The conversion circuit may include an encoder circuit to convert user data $b_1, b_2, b_3 \ldots b_k$ to a sequence $c_1, c_2 \ldots c_q$, and a transition minimization circuit to add $c_0$ to the sequence $c_1, c_2 \ldots c_q$.

The apparatus may have a circuit to append the coded sequence $c_0, c_1, c_2 \ldots c_q$ by adding at least one additional bit to the coded sequence $c_0, c_1, c_2 \ldots c_q$ to produce a sequence $c_0, c_1, c_2, \ldots, c_q, c_{q+1}, \ldots, c_m$. The at least one additional bit added to produce $c_0, c_1, c_2, \ldots, c_q, c_{q+1}, \ldots, c_m$ may include a parity bit.

According to another aspect, a method for coding includes adding a single bit to a input sequence of length q, and producing an output sequence of length q+1 having t transitions such that for any input sequence, t is an integer less than or equal to one half the maximum number of transitions and is represented by the following formula: $t \leq q/2$.

A computer readable medium may store a program for controlling at least one computer to perform the method.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Hereinafter, embodiments of the present invention will be described in detail with reference to the attached drawings. The present invention may, however, be embodied in many different forms and should not be construed as being limited to the embodiments set forth herein; rather, these embodiments are provided so that the present disclosure will be thorough and complete, and will fully convey the concept of the invention to those skilled in the art.

Figure 1:
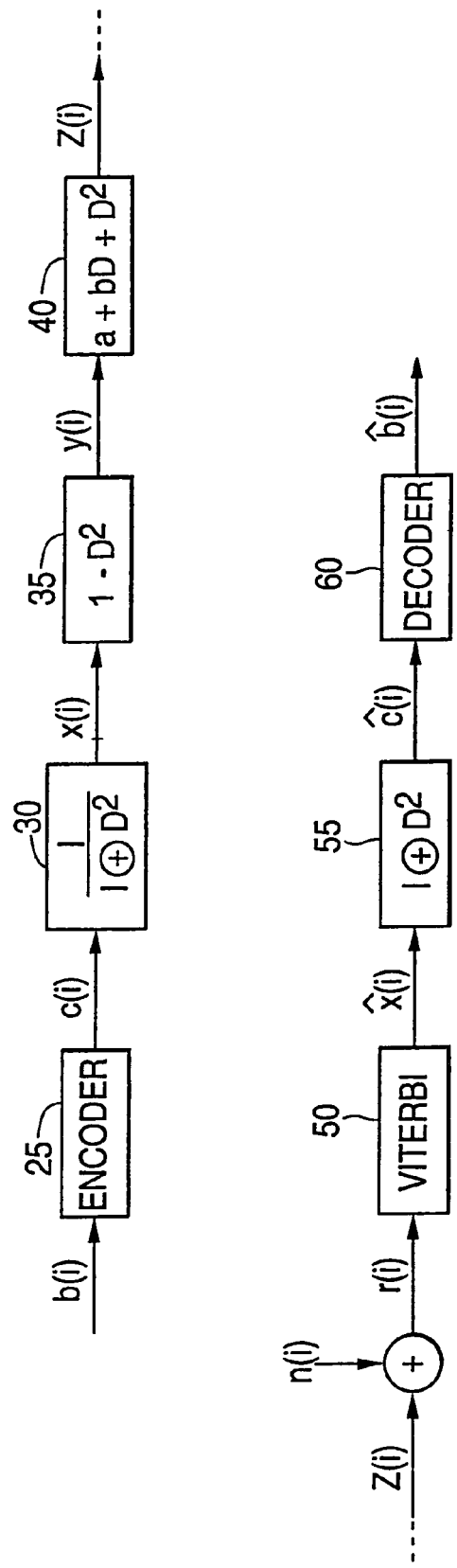
FIG. 1 is a diagram illustrating a configuration of a magnetic recording system of high rate coding for media noise, in accordance with an embodiment of the present invention.

In an embodiment according to the present invention, referring to FIG. 1, a user bit sequence, $b(i)$'s is encoded, for instance, by a rate k/m encoder 25 to produce bits, $c(i)$'s. In one exemplary embodiment, an Error Correcting Code (ECC) may generate the user bit sequence, b(i)'s. The encoder 25 receives k-bit blocks and produces m-bit blocks. The encoder 25 may include an application-specific integrated circuit (ASIC). The m-bit blocks are called codewords and m is called codeword length. The encoder 25 outputs the c(i) to a $1/(1 \oplus D^2)$ precoder 30. The encoder 25 and the precoder 30 receive, encode, and process data in a digital domain. In an alternative embodiment, the encoder 25 and the precoder 30 may be combined into one control block capable of encoding and precoding the user bit sequence, b(i)'s.

Thus, as shown in FIG. 1, the output, x(i)'s, of the precoder 30 pass through a cascade of channel filters denoted by $(1-D^2)$ 35 and $(a+bD+cD^2)$ 40. At the output of the filters, data z(i) is corrupted by additive noise, n's, r(i)=z(i)+n(i). Based on a received sequence, r(i)'s, a Viterbi detector 50 generates, $\hat{x}(i)$'s, which are reproductions of x(i)'s. Next, bits $\hat{x}(i)$'s are filtered by a filter $(1 \oplus D^2)$ 55, which is an inverse of the precoder 30, to generate $\hat{c}(i)$'s. In an alternative embodiment, the filter $(1 \oplus D^2)$ 55 may be provided with the Viterbi detector 50 as one unit. The $\hat{c}(i)$'s, are decoded by a decoder 60 to produce, $\tilde{b}(i)$'s, which are reproductions of the user bit sequence, b(i)'s. In one exemplary embodiment, an ECC decoder may receive the reproductions of the user bit sequence, $\tilde{b}(i)$'s. Further, if $x(i) \neq \hat{x}(i)$, then it is determined that a channel error occurred at time i. Further, if $b(i) \neq \tilde{b}(i)$, then it is determined that a decoder error occurred at time i.

As previously set forth, the encoder 25 outputs the c(i)'s to the $1/(1 \oplus D^2)$ precoder 30. The precoder 30 has at time, i, a state $s(i)=(s_2(i), s_1(i))$, an input, c(i), and an output x(i), where $x(i)=c(i) \oplus s_2(i)$. The state, s(i), is updated for time i+1, for instance, as follows: $s(i+1)=(s_2(i+1), s_1(i+1))$, where $s_2(i+1)=s_1(i)$ and $s_1(i+1)=x(i)$. In an embodiment where the precoder 30 comprises $1/(1 \oplus D)$, the precoder 30 would have at time, i, a state s(i), an input, c(i), and an output x(i), where $x(i)=c(i) \oplus s(i)$. The state, s(i), is updated for time i+1, for instance, as follows: $s(i+1)=x(i)$.

In addition to the user bit sequence, b(i)'s, the encoder 25 may use a state, $s(i)=(s_2(i), s_1(i))$, of the precoder 30 to generate c(i)'s, which will be explained in more detail below. The precoder 30 is a finite state component and includes a memory to store the state, s(i). Initially, a first state $(s_2(0), s_1(0))$ is preset to an initial value of, for instance, $(s_2(0), s_1(0))= (0, 0)$. In an alternative embodiment, the precoder 30 may be provided as $1/(1 \oplus D)$, where initially a first state, s(0), is preset to an initial value of, for instance, s(0)=0.

For instance, assuming that the preset state values of x(i-2) at i=0 and 1 are set to "0" and the input to the precoder 30, c(i)'s, include the following: c(0)=0, c(1)=0, c(2)=1, c(3)=1, and c(4)=0. The output, x(i)'s, of the precoder 30, would provide the relationship as shown in Table 1.

TABLE 1

| Output of Encoder | $1/(1 \oplus D^2)$ precoder |
|---|---|
| c(0) = 0 | x(0) = (c(0) ⊕ x(−2)) = (0 ⊕ 0) = 0 |
| c(1) = 0 | x(1) = (c(1) ⊕ x(−1)) = (0 ⊕ 0) = 0 |
| c(2) = 1 | x(2) = (c(2) ⊕ x(0)) = (1 ⊕ 0) = 1 |
| c(3) = 1 | x(3) = (c(3) ⊕ x(1)) = (1 ⊕ 0) = 1 |
| c(4) = 0 | x(4) = (c(4) ⊕ x(2)) = (0 ⊕ 1) = 1 |
| c(5) = 1 | x(5) = (c(5) ⊕ x(3)) = (1 ⊕ 1) = 0 |
| c(6) = 0 | x(6) = (c(6) ⊕ x(4)) = (0 ⊕ 1) = 1 |

Thus, a every time the input bit, c(i), to the precoder 30 is a "1", the output value of the output bit, x(i), of the precoder 30 equals the compliment of x(i−2). For other instances, when c(i)=0, the output bit, x(i), of the precoder 30 is x(i−2). In the alternative, if the $1/(1 \oplus D)$ precoder is used, then, each time the input bit, c(i), to the precoder 30 is "1", the output bit, x(i), of the precoder 30 is the compliment of x(i−1). For other instances, when c(i)=0, the output bit, x(i), of the $1/(1 \oplus D)$ precoder is x(i−1).

Although the reproductions of the user bit sequence, $\tilde{b}(i)$'s, should be same as the user bit sequence, b(i)'s, and the input to the precoder 30, c(i's, should be same as the output of the inverse of the precoder, $\hat{c}(i)$'s, the equality is not always possible because noise, such as media noise, is added to the output of the filters 35 and 40, z(i)'s. Jitter noise and/or pulse width noise happens only when there is a transition on the input to the channels 35 and 40. Accordingly, one way to reduce the noise is to reduce a number of transitions occurring at the input of the channels 35 and 40.

Figure 2:
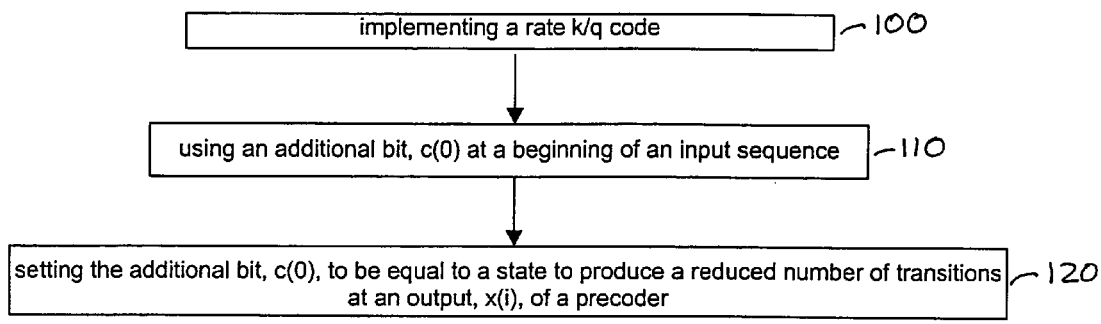
FIG. 2 illustrates a first embodiment of a high rate coding method performed by the encoder of FIG. 1.

FIG. 2 illustrates a first embodiment of a high rate coding method performed by the encoder 25 to generate a least number of transitions at the output of the precoder 30, and thus, at the input of the channels 35 and 40. At operation 100, a rate k/q code is implemented where the encoder 25 would receive the user bit sequence b(i)'s as k-bit blocks to generate the input sequence to the precoder 30 as $c_1, c_2, \ldots, c_q$. The operation 100 would resolve, for instance, one or more of RLL conditions, distance enhancement, clock recovery information, etc. At operation 110, the additional bit, $c_0$, is added at a beginning of the input sequence $c_1, c_2, \ldots, c_q$ to generate a codeword $c_0, c_1, c_2, \ldots, c_q$. At operation 120, the additional bit, $c_0$, is set to be equal to a value of "0" or "1" to produce a least number of transitions at the output, x(i), of the precoder 30 corresponding to the codeword $c_0, c_1, c_2, \ldots c_q$.

In an exemplary embodiment, x'=(x'(0), x'(1), ..., x'(q)) is the output of the precoder 30 and input of the channels 35 and 45, having an initial state, s=(s2, s1) and input (0, $c_1, c_2, \ldots, c_q$). Further, let x''=(x''(0), x''(1), ..., x''(q)) be the output of the precoder 30 and input of the channels 35 and 45, having the initial state, s=(s2, s1) and input (1, $c_1, c_2, \ldots, c_q$). Then, a maximum number of transitions, q, has the following relationship:

(Number of transitions in x')+(Number of transitions in x'')=q.

where: x'(2i+1)=x''(2i+1)  0≤i≤(q−1)/2, and x'(2i)=(1−x''(2i))  0≤i≤q/2.

Accordingly, the codeword, $(c_0, c_1, c_2, \ldots, c_q)$ generated according to the exemplary embodiment above will produce no more than q/2 transitions at the output of the precoder, such as one-half the maximum number of transitions.

For illustrative purposes, Table 2 illustrates x' and Table 3 illustrates x'', where the preset state values of s(0)=(s2(0), s1(0))=(0, 0). The inputs of the precoder 30 range from c(0) to c(9). Accordingly, the maximum number of transitions, q, would be 9.

TABLE 2

| Output of Encoder | $1/(1 \oplus D^2)$ precoder |
|---|---|
| c(0) = 0 | x'(0) = (c(0) ⊕ x'(−2)) = (0 ⊕ 0) = 0 |
| c(1) = 1 | x'(1) = (c(1) ⊕ x'(−1)) = (1 ⊕ 0) = 1 |
| c(2) = 1 | x'(2) = (c(2) ⊕ x'(0)) = (1 ⊕ 0) = 1 |
| c(3) = 0 | x'(3) = (c(3) ⊕ x'(1)) = (0 ⊕ 1) = 1 |
| c(4) = 1 | x'(4) = (c(4) ⊕ x'(2)) = (1 ⊕ 1) = 0 |
| c(5) = 0 | x'(5) = (c(5) ⊕ x'(3)) = (0 ⊕ 1) = 1 |
| c(6) = 1 | x'(6) = (c(6) ⊕ x'(4)) = (1 ⊕ 0) = 1 |
| c(7) = 0 | x'(7) = (c(7) ⊕ x'(5)) = (0 ⊕ 1) = 1 |
| c(8) = 0 | x'(8) = (c(8) ⊕ x'(6)) = (0 ⊕ 1) = 1 |
| c(9) = 0 | x'(9) = (c(9) ⊕ x'(7)) = (0 ⊕ 1) = 1 |

TABLE 3

| Output of Encoder | $1/(1 \oplus D^2)$ precoder |
| --- | --- |
| c(0) = 1 | x"(0) = (c(0) ⊕ x"(−2)) = (1 ⊕ 0) = 1 |
| c(1) = 1 | x"(1) = (c(1) ⊕ x"(−1)) = (1 ⊕ 0) = 1 |
| c(2) = 1 | x"(2) = (c(2) ⊕ x"(0)) = (1 ⊕ 1) = 0 |
| c(3) = 0 | x"(3) = (c(3) ⊕ x"(1)) = (0 ⊕ 1) = 1 |
| c(4) = 1 | x"(4) = (c(4) ⊕ x"(2)) = (1 ⊕ 0) = 1 |
| c(5) = 0 | x"(5) = (c(5) ⊕ x"(3)) = (0 ⊕ 1) = 1 |
| c(6) = 1 | x"(6) = (c(6) ⊕ x"(4)) = (1 ⊕ 1) = 0 |
| c(7) = 0 | x"(7) = (c(7) ⊕ x"(5)) = (0 ⊕ 1) = 1 |
| c(8) = 0 | x"(8) = (c(8) ⊕ x"(6)) = (0 ⊕ 0) = 0 |
| c(9) = 0 | x"(9) = (c(9) ⊕ x"(7)) = (0 ⊕ 1) = 1 |

As shown in Table 2, if the additional bit c(0) added to the input of the precoder 30, in accordance with an embodiment of the present invention, is set to equal to zero, then the output of the precoder 30, x'(i), transitions three times. Specifically, as a first transition, the output of the precoder 30 transitions from x'(0)=0 to x'(1)=1. Subsequently, as a second transition, the output of the precoder 30 transitions from x'(3)=1 to x'(4)=0. As a third transition, the output of the precoder 30 transitions from x'(4)=0 to x'(5)=1.

In contrast, as shown in Table 3, if the additional bit c(0) added to the input of the precoder 30, in accordance with an embodiment of the present invention, is set to equal to one, then the output of the precoder 30, x"(i), transitions six times. Specifically, as a first transition, the output of the precoder 30 transitions from x"(1)=1 to x"(2)=0. As a second transition, the output of the precoder 30 transitions from x"(2)=0 to x"(3)=1, and as a third transition, the output of the precoder 30 transitions from x"(5)=1 to x–(6)=0. Subsequently, as a fourth transition, the output of the precoder 30 transitions from x"(6)=0 to x"(7)=1, and as a fifth transition, the output of the precoder 30 transitions from x"(7)=1 to x"(8)=0. Finally, as a sixth transition, the output of the precoder 30 transitions from x"(8)=0 to x"(9)=1. Accordingly, to reduce the number of transitions at the output of the precoder 30, to thereby resolve, for instance, the reduction of media noise, the additional bit, c(0), would be best set to equal to zero. In an alternative embodiment, two additional bits may be used at the beginning of the input sequence to a precoder 30 of $c_1, c_2, \ldots, c_q$ to significantly reduce a number of transitions at the input of channel filters 35 and 40 in the magnetic recording medium.

For instance, for a rate of 80/81, the encoder 25 of the first embodiment receives 80 bits, b=(b(01)–b(80)), and generates a codeword, c=(c(00) c(01) . . . c(81)), where (c(01) . . . c(81)), is a codeword generated by a code, C, in response to (b(01)–b(80)), and where, c(00), is obtained based on operation 120 of the first embodiment. In turn, the decoder 60 receives 82 bits, ĉ=[ĉ(0) ĉ(1) . . . ĉ(80) ĉ(81)], and generates, b̂=[b̂(1) b̂(2) . . . b̂(80)], where, b̂, is generated by the code, C, decoder in response to, ĉ(1) . . . ĉ(80) ĉ(81). The C code improves the RLL conditions, the distance enhancement, and/or the clock recovery information. Details of the C code are set forth in the U.S. patent application titled "MODULATION CODING BASED ON AN ECC INTERLEAVE STRUCTURE," filed concurrently herewith, the disclosure of which is incorporated herewith by reference.

Figure 3:
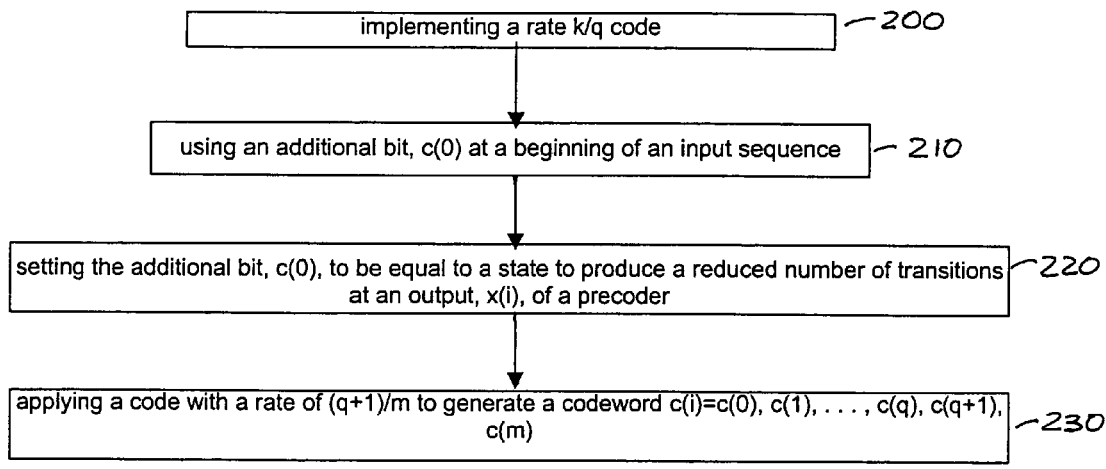
FIG. 3 illustrates a second embodiment of the high rate coding method performed by the encoder of FIG. 1.

FIG. 3 illustrates a second embodiment of a high rate coding method performed by the encoder 25 to generate the reduced number of transitions at the output of the precoder 30, and thus, at the input of the channels 35 and 40. Appendix A of the present application illustrates a pseudo code for the first and second embodiments illustrating the addition of the additional bit, $c_0$, the determination of the reduced number of transitions, the generation and decoding of $c_1$, and an addition of a parity bit, $c_m$. The method of the second embodiment, in addition to reducing the number of transitions at the output of the precoder 30 or at the input of the channels 35 and 40 to reduce the media noise, inserts the parity bit, $c_m$, to force an even parity structure at the output of the precoder 30.

In particular, operations 200, 210, and 220 of FIG. 3 are same as operations 100, 110, and 120, respectively, of FIG. 2 accordingly, the detailed description of the operations provided above is incorporated herein. At operation 230, a systematic code is applied with a rate (q+1)/m to generate a codeword $c(i)=(c_0, c_1, c_2, \ldots, c_q, c_{q+1}, \ldots, c_m)$. Specifically, at least one bit $(c_{q+1}, \ldots, c_m)$ is added at the end of the codeword $(c_0, c_1, c_2, \ldots, c_q, c_{q+1}, \ldots, c_m)$. If $c_0$ is calculated and inserted after the parity bit $c_m$ is added, some of the parity properties of the codeword may be corrupted. By adding the parity bit after $c_0$ has been determined, it is possible to accurately count the number of "1"s. In an alternative embodiment, the at least one bit $(c_{q+1}, \ldots, c_m)$, may be added at some middle point within the codeword.

One example of exactly one bit $c_{q+1}$, where $c_{q+1}$ is the parity bit, is as follows: given 64 user bits b=(b(1), b(2), . . . b(63), b(64)), and state, s=(s_2, s_1), of the precoder 30, the encoder 25 produces a 67 bit codeword, $$c=[c(0)\ c(1) \ldots c(65)\ c(66)],$$

where (c(1) . . . c(65)) is a codeword generated by the code C, in response to b. Bit, c(0), is generated as follows:

c(0)=0 if number of transitions of $x'=(x'(0), \ldots, x'(65)) \leq 33$, and c(0)=1 if number of transitions of $x''=(x''(0), \ldots, x''(65)) \leq 33$, where, as before, x', is the output of, $1/(1 \oplus D^2)$, precoder 30 having an initial state, s=(s_2, s_5), and input (0, c(1), c(2), . . . , c(65)). Further, x", is the output of the precoder having initial state, s=(s_2, s_1), and input (1, c(1), c(2), . . . , c(65)). The above description of c(0) is valid due to the following relationship:

Number of transitions of (x')+Number of transitions of (x")=65

Subsequently, bit c(66) is generated as follow:

$$c(66) = (binary)\left(\sum_{i=0}^{15} c(4i+1) + \sum_{i=0}^{15} c(4i+2) + c(65) + s1\right)$$

where bit c(66) is such that x(0)+x(1)+ . . . +x(66) has even number of ones (even parity.)

Accordingly, the bit, c(m), is such that x(0)+x(1)+ . . . +x(m) has an even number of ones (i.e., even parity). Thus, the second embodiment of the present invention provides flexibility to allow resolving parity issues. Specifically, in one exemplary embodiment, the codeword or output of the encoder 25, c(i)'s, generated at operation 200 has an original even parity at the output of the precoder 30. At operation 220, by allowing the addition of the bit, $c_m$, after the value of the additional bit, $c_0$, is determined, the even parity of the codeword, $(c_0, c_1, c_2, \ldots, c_q, c_{q+1}, \ldots, c_m)$, may be achieved. In alternative embodiments, additional bits may be added to the codeword $(c_0, c_1, c_2, \ldots, c_q, c_{q+1}, \ldots, c_m)$ for other purposes.

One of the many advantages of the methods of FIGS. 2 and 3, in accordance with an embodiment of the present invention, is that the method reduces an average media noise. Another of the many advantages is that the method of FIGS. 2 and 3 does not permit sequences, c, that generate a lot of transitions in x.

Although the method in accordance with an embodiment of the present invention is described in the context of a $1/(1 \oplus D^2)$ precoder, the application of the method is not limited to $1/(1 \oplus D^2)$ precoder. For instance, for a $1/(1 \oplus D)$ precoder, the embodiments below reduce (in average) the number of transitions at the output of the precoder 30, thus, controlling media noise. First embodiment, a $1/(1 \oplus D)$ term is added to the code—effectively making the precoder look like $1/(1 \oplus D^2)$. Second embodiment, it must be noted that when precoder is $1/(1 \oplus D)$, a "1" in $c(i)$'s causes a transition in $x(i)$'s. Therefore, in construction of a code, operations 120 and 220 of FIGS. 2 and 3 are changed, respectively, as follows, after inserting, $c_0$, and modify $c_1, \ldots, c_q$ to generate a codeword $(c_0, c_1, \ldots, c_q)$ as follows:

$(c_0, c_1, c_2, \ldots, c_q) = (0, c_1, \ldots, c_q)$, if $c_1 + \ldots + c_q \leq \lfloor q/2 \rfloor$, and $(c_0, c_1, c_2, \ldots, c_q) = (1-0, 1-c_1, \ldots, 1-c_q)$, otherwise.

The present invention has been described with respect to a system and method performing high rate coding by adding one additional bit to a beginning of the input sequence to a precoder as $(c_1, c_2, \ldots, c_q)$ and controlling a value of the additional bit to significantly reduce a number of transitions at an input of channel filters in a magnetic recording medium to reduce an amount of noise.

The system implementing the method described above includes permanent or removable storage, such as an application specific integrated circuit (ASIC), magnetic and optical discs, RAM, ROM, etc. on which the process and data structures of the present invention can be stored and distributed. The processes can also be distributed via, for example, downloading over a network such as the Internet. Although the system of the present invention has been described in view of a magnetic recording medium, the system may be incorporated and applied to other communication systems.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An apparatus connected to an Error Correcting Cads (ECC) generating a user bit sequence, the apparatus comprising:

an encoder adding a bit, $c_0$, at a beginning of $c_1, c_2, \ldots, c_q$ bit blocks output from the encoder to determine a reduced number of transitions of the user bit sequence;

a precoder receiving and processing the $c_0, c_1, c_2, \ldots, c_q$ bit blocks and generating a corresponding outputs $x_0, x_1, x_2 \ldots x_q$ using $x_i = c_i \oplus x_{i-2}$;

a channel filter receiving and processing the outputs $x_0, x_1, x_2 \ldots x_q$ and generating data $z_0, z_1, z_2 \ldots z_q$, which is corrupted by an additive noise, $n(i)$;

a Viterbi detector receiving the data $z_0, z_1, z_2 \ldots z_q$ and the additive noise, $n(i)$, and generating bits $\hat{x}_0, \hat{x}_1, \hat{x}_2 \ldots \hat{x}_q$;

a filter filtering the bits $\hat{x}_0, \hat{x}_1, \hat{x}_2 \ldots \hat{x}_q$ and generating bits $\hat{c}_0, \hat{c}_1, \hat{c}_2 \ldots \hat{c}_q$; and a decoder decoding the bits $\hat{c}_0, \hat{c}_1, \hat{c}_2 \ldots \hat{c}_q$ to produce an output bit sequence that is a reproduction of the user bit sequence.

2. The apparatus as recited in claim 1, wherein the filter is an inverse of the precoder.

3. The apparatus as recited in claim 1, wherein the channel filter comprises a combination of a filter denoted by $(1-D^2)$ and a filter denoted by $(a+bD+cD^2)$.

4. The apparatus as recited in claim 1, wherein the precoder is a $1/(1 \oplus D^2)$ precoder having at time, i, a state $s(i)=(s_2(i), s_1(i))$, an input, $c(i)$, and an output $x(i)$, where $x(i)=c(i) \oplus s_2(i)$, and the state, $s(i)$, is updated for time i+1, as follows: $s(i+1)=(s_2(i+1), s_1(i+1))$, where $s_2(i+1)=s_1(i)$ and $s_1(i+1)x(i)$.

5. The apparatus as recited in claim 1, wherein the precoder is a $1/(1 \oplus D)$ precoder having at time, i, a state $s(i)$, an input, $c(i)$, and an output $x(i)$, where $x(i)=c(i) \oplus s(i)$, and the state, $s(i)$, is updated for time i+1, as follows: $s(i+1)=x(i)$.

6. The apparatus as recited in claim 1, wherein if $x(i) \neq \hat{x}(i)$, then the apparatus determines that a channel error occurred at time i and, if $b(i) \neq \hat{b}(i)$, then the apparatus determines that a decoder error occurred at time i.

7. An apparatus connected to an Error Correcting Code (ECC) generating a user bit sequence, the apparatus comprising:

an encoder adding a bit, $c_0$, at a beginning of $c_1, c_2, \ldots, c_q$ bit blocks output from the encoder to determine a least number of transitions of the user bit sequence;

a precoder receiving and processing the $c_0, c_1, c_2, \ldots, c_q$ bit blocks and generating a corresponding outputs $x_0, x_1, x_2 \ldots x_q$ using $x_i = c_i \oplus x_{i-2}$;

a channel filter receiving and processing the outputs $x_0, x_1, x_2 \ldots x_q$ and generating data $z_0, z_1, z_2 \ldots z_q$, which is corrupted by an additive noise, $n(i)$;

a Viterbi detector receiving the data $z_0, z_1, z_2 \ldots z_q$ and the additive noise, $n(i)$, and generating bits $\hat{x}_0, \hat{x}_1, \hat{x}_2 \ldots \hat{x}_q$;

a filter filtering the bits $\hat{x}_0, \hat{x}_1, \hat{x}_2 \ldots \hat{x}_q$ and generating bits $\hat{c}_0, \hat{c}_1, \hat{c}_2 \ldots \hat{c}_q$; and a decoder decoding the bits $\hat{c}_0, \hat{c}_1, \hat{c}_2 \ldots \hat{c}_q$ to produce an output bit sequence that is a reproduction of the user bit sequence.

8. The apparatus as recited in claim 7, wherein the precoder is a $1/(1 \oplus D^2)$ precoder having at time, i, a state $s(i)=(s_2(i), s_1(i))$, an input, $c(i)$, and an output $x(i)$, where $x(i)=c(i) \oplus s_2(i)$, and the state, $s(i)$, is updated for time i+1, as follows: $s(i+1)=(s_2(i+1), s_1(i+1))$, where $s_2(i+1)=s_1(i)$ and $s_1(i+1)=x(i)$.

9. The apparatus as recited in claim 7, wherein the precoder is a $1/(1 \oplus D)$ precoder having at time, i, a state $s(i)$, an input, $c(i)$, and an output $x(i)$, where $x(i)=c(i) \oplus s(i)$, and the state, $s(i)$, is updated for time i+1, as follows: $s(i+1)=x(i)$.

10. The apparatus as recited In claim 7, wherein if $x(i) \neq \hat{x}(i)$, then the apparatus determines that a channel error occurred at time i and, if $b(i) \neq \hat{b}(i)$, then the apparatus determines that a decoder error occurred at time i.

* * * * *

UNITED STATES PATENT AND TRADEMARK OFFICE
CERTIFICATE OF CORRECTION

| | | |
|---|---|---|
| PATENT NO. | : 7,053,801 B2 | Page 1 of 1 |
| APPLICATION NO. | : 10/869843 | |
| DATED | : May 30, 2006 | |
| INVENTOR(S) | : William G. Bliss et al. | |

It is certified that error appears in the above-identified patent and that said Letters Patent is hereby corrected as shown below:

Column 7, Line 55, change "Cads" to --Code--.

Column 8, Line 19, change "$S_1(i+1)x(i).$" to --$S_1(i+1)=x(i).$--.

Column 8, Line 59, change "In" to --in--.

Signed and Sealed this

Twenty-first Day of November, 2006

JON W. DUDAS
*Director of the United States Patent and Trademark Office*